US 6,664,799 B2

(12) United States Patent
Lovett

(10) Patent No.: US 6,664,799 B2
(45) Date of Patent: Dec. 16, 2003

(54) METHOD AND APPARATUS FOR ENABLING A DIGITAL MEMORY TESTER TO READ THE FREQUENCY OF A FREE RUNNING OSCILLATOR

(75) Inventor: Simon J. Lovett, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 62 days.

(21) Appl. No.: 09/735,526

(22) Filed: Dec. 14, 2000

(65) Prior Publication Data

US 2002/0125903 A1 Sep. 12, 2002

(51) Int. Cl.[7] ............................ G01R 31/02; G01R 1/04
(52) U.S. Cl. ..................... 324/765; 324/158.1; 324/763
(58) Field of Search .................................. 324/765, 763, 324/158.1, 73.1, 537; 714/718, 724, 726, 727, 731, 733, 736

(56) References Cited

U.S. PATENT DOCUMENTS

| 4,890,270 A | * | 12/1989 | Griffith ........................ 368/113 |
| 5,083,299 A | * | 1/1992 | Schwanke et al. ......... 324/73.1 |
| 5,099,196 A | | 3/1992 | Longwell et al. |
| 5,341,096 A | * | 8/1994 | Yamamura .................. 324/765 |
| 5,428,626 A | * | 6/1995 | Frisch et al. ............... 324/73.1 |
| 5,457,400 A | * | 10/1995 | Ahmad et al. .............. 324/765 |
| 5,619,463 A | | 4/1997 | Malhi |
| 5,796,751 A | | 8/1998 | Kundu |
| 5,852,616 A | | 12/1998 | Kubinec |
| 6,069,849 A | * | 5/2000 | Kingsley et al. ........... 324/73.1 |

FOREIGN PATENT DOCUMENTS

GB      2 217 465 A      9/1988

* cited by examiner

Primary Examiner—Kamand Cuneo
Assistant Examiner—Jermele Hollington
(74) Attorney, Agent, or Firm—Dickstein Shapiro Morin & Oshinsky LLP

(57) ABSTRACT

An apparatus and method are provided for testing and sorting semiconductor dies based on performance characteristics. A tester is provided that supplies a pulse to an oscillator fabricated in association with a die under test. A counter is provided which counts oscillations of the oscillator to a predetermined value. Once the counter counts to the predetermined value, it provides a signal to the tester. The tester determines the elapsed time between when the oscillator is activated and when the signal is received from the counter and determines the frequency of the oscillator from the elapsed time.

29 Claims, 1 Drawing Sheet

METHOD AND APPARATUS FOR ENABLING A DIGITAL MEMORY TESTER TO READ THE FREQUENCY OF A FREE RUNNING OSCILLATOR

FIELD OF THE INVENTION

The present invention relates to the field of integrated circuit devices. More specifically, it relates to testing and sorting individual integrated circuit devices according to their operational characteristics.

BACKGROUND OF THE INVENTION

Integrated circuit devices, or dies, are manufactured through a multi-step process during which transistors and other electronic circuit components are formed in areas on a thin silicon wafer. After the circuit fabrication is completed, the individual dies are cut from the silicon wafer.

The manufacturing process for integrated circuits is imprecise; minor variations during each step of the manufacturing process affect vital performance characteristics of individual dies. These variations impact the speed at which a particular die operates, which directly impacts the commercial value of each individual die. It is therefore desirable to the manufacturer to determine the speed at which individual dies can operate so the manufacturer can then sort them accordingly.

Typical integrated circuit test devices consist of bench setups utilizing standard lab equipment including an oscilloscope or frequency meter to directly or indirectly measure the operating frequency (speed) of the circuit. In some setups such outboard test equipment is used to test the speed of a device, such as an oscillator, which is fabricated in association with a die but which is not materially part of the operational die circuit. The tested frequency of the oscillator is representative of the operational speed of the die. All these systems, however, require expensive specialized and sometimes bulky frequency measurement equipment to be provided with the test setup.

What is needed is a simplified method and apparatus for determining the operating speed of the die.

SUMMARY OF THE INVENTION

The present invention provides a method and apparatus for characterizing an integrated circuit device based on device switching speed on an individual die or lot-by-lot basis by measuring frequency in a digital domain. An oscillator, integrated in association with the die and capable of generating pulses, and a counter are used during a test period to count the pulses from the oscillator to a predetermined value. A pulse generator is initiated at the beginning of a test which resets the counter to a known state and starts the oscillator. When the counter reaches its predetermined maximum count value a signal is issued. The elapsed time between the initiation of the oscillator and when the counter full signal is issued represents the summation of many oscillator periods. The period of the oscillator may then be determined by the formula: oscillator period=elapsed time/capacity of counter. The determined oscillator period provides an indication of the operating speed of electronic devices on the die. A digital tester which performs other tests on the die can be used to record the elapsed time and thereby determine the operating speed of a die.

These and other features of the invention will be more clearly understood from the following detailed description of the invention which is provided in connection with the accompanying drawing.

DETAILED DESCRIPTION OF THE PREFERRED EMBODIMENTS

Figure 1:
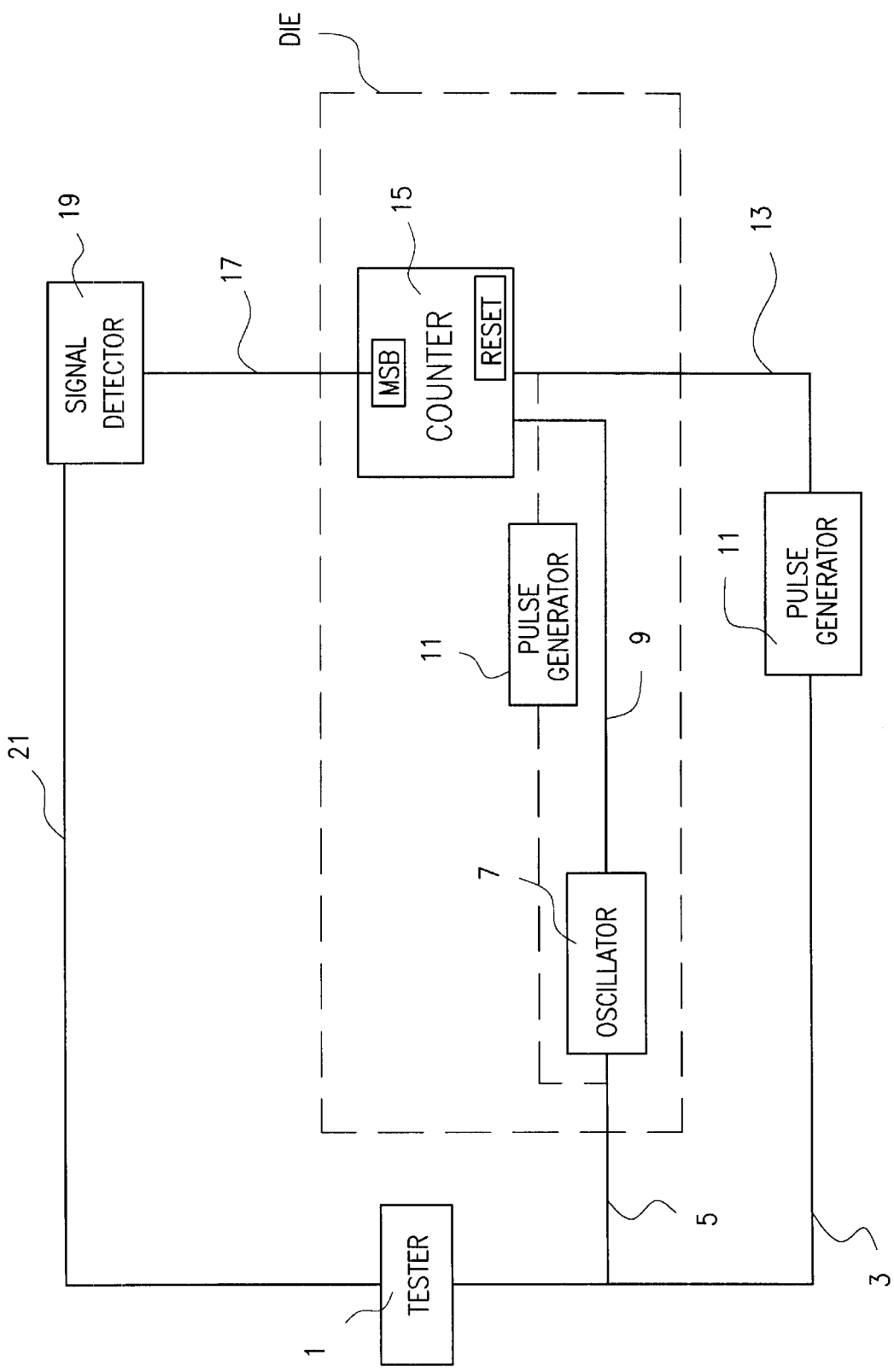
FIG. 1 is a block diagram of a frequency measurement system in accordance with an exemplary embodiment of the invention.

As illustrated in FIG. 1, the invention provides a speed measuring system for a die which includes a die tester 1, an oscillator 7, a pulse generator 11, a counter 15, and a signal detector 19.

The oscillator 7 and counter 15 are fabricated in association with a die to be tested. Thus, as indicated by the dotted box in FIG. 1, oscillator 7 and counter 15 are fabricated on a die. Alternatively, they may be fabricated within a scribe line next to a die whose speed needs to be determined. It should be noted that oscillator 7 and counter 15 may form part of the operating circuitry of a die when integrated on the die, or they may form no part of the actual die operating circuitry. Pulse generator 11 may also be fabricated on the die or may be an external element as shown in FIG. 1. The preferred embodiment is to have the pulse generator 11 on the die, as indicated by dashed lines in FIG. 1, because this requires one less pad to interface with the die.

The tester 1 is a digital tester which performs various tests on a die. It has terminals for connection to terminals on a die and is capable of measuring different operational characteristics of a die. For purposes of the present invention, tester 1 generates a pulse test signal that is carried to the oscillator 7 via a signal line 5. Preferably, the pulse test signal is of long duration, in the order of microseconds or milliseconds. The oscillator may be a ring oscillator. However, any type of an oscillator device, which, as noted, is located on the die or in a scribe channel can be utilized in the present invention.

The appearance of the pulse test signal from the tester 1 turns on oscillator 7 and also actuates the pulse generator 11 via a signal line 3. The pulse generator 11 can be located with the oscillator 7 and counter 15 on or adjacent to a die, or can be associated with tester 1. The pulse generator 11 in turn provides a reset signal to the counter 15 via a signal line 13. This signal resets the counter 15 to a zero, or other known state. In this embodiment counter 15 is a binary ripple counter, however, any digital counter may be utilized. The counter 15 is quickly reset by pulse generator 11 before oscillator 7 can begin outputting pulses. The counter 15 is thus set to a zero or other known state prior to receiving any signals from the oscillator 7. Oscillator 7 in response to the signal on line 5 produces pulses that are sent to the counter 15 via a signal line 9.

The counter 15 can count to a predetermined digital value and, when it reaches that value, it produces an output signal on line 17. The fact that the counter has counted to the predetermined value is indicated when counter 15 has counted to a value which changes the Most Significant Bit (MSB). The MSB state stage indicates that the maximum capacity of the counter, a known number of pulses, has been counted. The MSB signal line 17 is monitored by signal detector 19 and when a signal is present a detection signal is sent on line 21 to tester 1. Signal detector 19 can also be located with the oscillator 7 and counter 15 on or adjacent to a die, or can be associated with tester 1.

When signal detector 19 sends a signal to tester 1 indicating that the MSB has been reached, the tester 1 then determines the elapsed time between when the oscillator 7 was initiated and when counter 15 counted to its predetermined value. The time at which the tester 1 generated the signal on line 5 is known, and the time at which the detection signal is received by the tester 1 is known. The elapsed time between these events is used by tester 1 to determine the oscillator 7 frequency. Because the number of pulses which counter 15 can count to is predetermined, the period of the oscillator 7 is simply determined by dividing the elapsed time by the predetermined number of counted pulses. The frequency of oscillator 7 is thus also known as frequency= 1/period.

Once the frequency or other operational characteristics of a particular die, or group of dies, is known, the dies can be sorted according to those characteristics. The tester 1 can mark the dies according to results of the determined frequency on an individual die or lot-by-lot basis. The tester can accomplish marking of the tested dies by etching the dies, or any other method that would indicate the determined frequency of the tested die to the manufacturer. The tester can store on disk the counted ring oscillator data for a particular wafer or die and use this information to sort or bin the die or wafer. After the dies are tested, the dies can be sorted by tester 1 according to their measured performance characteristics. For example, the dies can be sorted according to a required minimum or maximum frequency benchmark. Alternatively, the dies can be sorted according to a required frequency range. Sorting the dies as such will allow the manufacturer to sell the dies according to their value based on performance characteristics, or to utilize the dies more efficiently in manufacturing processes.

Thus, a simple digital circuit is provided which can be used to easily provide an indication of the operational speed of a die and/or semiconductor devices fabricated therein.

Although the invention has been described with reference to providing counter 15 on or near a die whose operating speed is to be measured, it is also possible to provide counter 15 on the tester 1 and only oscillator 7 need be fabricated on or near a die to be tested.

While exemplary embodiments of the invention have been described and illustrated, it should be apparent that many modifications can be made to the present inventions without departing from its spirit and scope. Accordingly the invention is not limited by the foregoing description or drawings, but is only limited by the scope of the appended claims.

What is claimed as new and desired to be protected by Letters Patent of the United States is:

1. A method for indicating operating speed of a semiconductor die, the method comprising:
   providing a signal to an oscillator fabricated in association with a die;
   counting output pulses of said oscillator up to a predetermined value of pulses stored in a counter;
   determining a time period between the time said oscillator is activated until said predetermined value is counted; and
   using said time period to determine the frequency of said oscillator.

2. The method according to claim 1 wherein said oscillator is a ring oscillator.

3. The method according to claim 1 further comprising the step of counting said output pulses with said counter and resetting said counter to a known state before said counter begins said counting.

4. The method according to claim 3 wherein said predetermined value is maximum value countable by said counter.

5. The method according to claim 3 further comprising the step of sending a signal from said counter to a die tester indicating that said predetermined value has been counted.

6. The method according to claim 5 wherein said counting is performed by a binary ripple counter.

7. A method for sorting a semiconductor die according to the performance characteristics of the die, the method comprising:
   providing a signal to activate an oscillator fabricated in association with a die to be tested;
   counting output pulses of said oscillator to a maximum value of pulses countable by a counter;
   determining a time period between the time said oscillator is activated until said predetermined value is counted;
   using said time period to determine the frequency of said oscillator; and
   using said determined frequency as at least one criteria for sorting said die.

8. The method according to claim 7 further comprising the step of counting said output pulses with said counter and resetting said counter to a known state before said counter begins said counting.

9. The method according to claim 8 further comprising the step of sending a signal from said counter to a die tester indicating that said predetermined value has been counted.

10. An apparatus for indicating operating speed of a semiconductor die, the apparatus comprising:
    an oscillator fabricated in association with a die for producing an oscillating signal;
    a signal generator for activating said oscillator;
    a counter for counting oscillations from said oscillator up to a predetermined value stored in said counter;
    a testing apparatus for determining the time period between the time said oscillator is activated and said predetermined value is counted and for determining the frequency of said oscillator from said time period.

11. The apparatus according to claim 10 wherein at least said oscillator is fabricated on a die to be tested.

12. The apparatus according to claim 10 wherein at least said oscillator and said counter are fabricated on a die to be tested.

13. The apparatus according to claim 10 wherein said predetermined value is maximum value countable by said counter.

14. The apparatus according to claim 10 further comprising a means for resetting said counter to a known state.

15. The apparatus according to claim 14 wherein said means for resetting is a pulse generator.

16. The apparatus according to claim 15 wherein said signal generator provides an activating signal to said oscillator and a signal to said pulse generator which causes said pulse generator to reset said counter to a known state before said counter begins counting said oscillations.

17. A fabricated die comprising:
    an oscillator;
    a counter coupled to said oscillator for counting oscillations of said oscillator to a predetermined value of oscillations;
    a first signal line coupled to said oscillator for receiving an activation signal external of said die which turns said oscillator on; and
    a second signal line coupled to said counter for providing a signal external to said die when said counter counts to said predetermined value.

18. The fabricated die as in claim 17 further comprising a pulse generator coupled to said first signal line for resetting said counter before said counter starts counting oscillations.

19. The fabricated die as in claim 17 wherein said second signal line is coupled to a most significant bit position of said counter.

20. The fabricated die according to claim 17 wherein said oscillator is a ring oscillator.

21. The fabricated die according to claim 17 wherein said counter is a binary ripple counter.

22. An apparatus for sorting a semiconductor die according to the performance characteristics of the die, the apparatus comprising:

an oscillator fabricated in association with a die for producing an oscillating signal;

a signal generator for activating said oscillator, a counter for counting oscillations from said oscillator to a predetermined value; and a tester for sending a signal to activate said oscillator, for determining the time period between activating said oscillator and counting said predetermined value, for determining the frequency of said oscillator based on said time period, and for providing information for sorting said die based on said determined frequency.

23. The apparatus according to claim 22 wherein said counter sends a signal to said tester when said predetermined value has been counted.

24. The apparatus according to claim 22 further comprising a pulse generator for resetting said counter to a known state.

25. The apparatus according to claim 24 wherein said tester provides a signal to said pulse generator to reset said counter to a known state.

26. An apparatus for marking semiconductor dies according to performance characteristics of the dies, the apparatus comprising:

an oscillator fabricated in association with a die for producing an oscillating signal;

a signal generator for activating said oscillator;

a counter for counting oscillations from said oscillator up to a predetermined value of oscillations; and a tester for sending a signal to activate said oscillator, for determining the time period between activating said oscillator and counting said predetermined value, for determining the frequency of said oscillator based on said time period, and for marking said die according to said determined frequency.

27. The apparatus according to claim 26 wherein said counter sends a signal to said tester when said predetermined value has been counted.

28. The apparatus according to claim 26 further comprising a pulse generator for resetting said counter to a known state.

29. The apparatus according to claim 28 wherein said tester provides a signal to said pulse generator to reset said counter to a known state.

* * * * *